United States Patent
Taher Kouhestani et al.

(10) Patent No.: US 12,367,639 B2
(45) Date of Patent: Jul. 22, 2025

(54) THREE-DIMENSIONAL (3D) MODELING

(71) Applicant: Telefonaktiebolaget LM Ericsson (publ), Stockholm (SE)

(72) Inventors: AmirHossein Taher Kouhestani, Solna (SE); Volodya Grancharov, Solna (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 154 days.

(21) Appl. No.: 17/795,783

(22) PCT Filed: Jan. 31, 2020

(86) PCT No.: PCT/EP2020/052502
§ 371 (c)(1),
(2) Date: Jul. 27, 2022

(87) PCT Pub. No.: WO2021/151513
PCT Pub. Date: Aug. 5, 2021

(65) Prior Publication Data
US 2023/0085970 A1    Mar. 23, 2023

(51) Int. Cl.
*G06T 17/00* (2006.01)
*G06F 3/01* (2006.01)
*G06T 7/70* (2017.01)

(52) U.S. Cl.
CPC .............. *G06T 17/00* (2013.01); *G06F 3/013* (2013.01); *G06T 7/70* (2017.01); *G06T 2207/20104* (2013.01)

(58) Field of Classification Search
None
See application file for complete search history.

(56) References Cited

U.S. PATENT DOCUMENTS

| | | | |
|---|---|---|---|
| 8,791,851 B2* | 7/2014 | Elad | G01V 8/005 |
| | | | 342/22 |
| 8,848,201 B1 | 9/2014 | Bruce et al. | |
| 2010/0182232 A1* | 7/2010 | Zamoyski | G06F 3/013 |
| | | | 345/157 |
| 2015/0193658 A1 | 7/2015 | Miller et al. | |
| 2016/0262663 A1* | 9/2016 | Maclaren | A61B 5/6803 |
| 2016/0292869 A1 | 10/2016 | Hammond et al. | |

(Continued)

FOREIGN PATENT DOCUMENTS

| | | |
|---|---|---|
| CN | 108139799 A | 6/2018 |
| EP | 3246660 A1 | 11/2017 |

(Continued)

OTHER PUBLICATIONS

International Search Report and Written Opinion issued in International Application No. PCT/EP2020/052502, dated Nov. 24, 2020 (28 pages).

(Continued)

*Primary Examiner* — Anh-Tuan V Nguyen
(74) *Attorney, Agent, or Firm* — Rothwell, Figg, Ernst & Manbeck, P.C.

(57) ABSTRACT

A method (500) for 3D modeling of one or more regions of interest. The method includes obtaining (s502) information indicating that a person's gaze is fixed. Advantageously, the method further includes, in response to obtaining the information indicating that the person's gaze is fixed, initiating (s504) an active scan of a region of interest (ROI), wherein the ROI is a region in which the person's gaze is directed.

20 Claims, 7 Drawing Sheets

(56) References Cited

U.S. PATENT DOCUMENTS

| | | | | |
|---|---|---|---|---|
| 2016/0379370 | A1* | 12/2016 | Nakazato | G06T 7/50 |
| | | | | 382/103 |
| 2017/0337743 | A1* | 11/2017 | Metzler | G01C 1/04 |
| 2018/0077345 | A1 | 3/2018 | Yee | |
| 2018/0120196 | A1* | 5/2018 | Georgeson | G01N 21/88 |
| 2018/0158197 | A1* | 6/2018 | Dasgupta | G06T 3/60 |
| 2018/0160048 | A1 | 6/2018 | Rainisto et al. | |
| 2018/0218533 | A1* | 8/2018 | Millin | G08G 5/0086 |
| 2019/0050664 | A1 | 2/2019 | Yang et al. | |
| 2019/0066283 | A1* | 2/2019 | Gros | G05D 1/0094 |
| 2019/0094854 | A1 | 3/2019 | Seiler et al. | |
| 2019/0262078 | A1* | 8/2019 | Lang | A61B 17/1775 |
| 2020/0404610 | A1* | 12/2020 | Crouch | G01S 5/0036 |
| 2021/0349528 | A1* | 11/2021 | Son | G06F 3/013 |

FOREIGN PATENT DOCUMENTS

| | | |
|---|---|---|
| KR | 10-2011-0098966 A | 9/2011 |
| KR | 10-2019-0118643 A | 10/2019 |
| WO | 2018/174803 A1 | 9/2018 |

OTHER PUBLICATIONS

Anonymous: "Lidar—Wikipedia, version as on Jul. 15, 2018", XP055685503 (30 pages).

Yuan, et al, "Human Gaze-Driven Spatial Tasking of an Autonomous MAV" IEEE Robotics and Automation Letters, vol. 4, No. 2, Apr. 2019 (pp. 1343-1350).

Gutmann, et. al., "Incremental Mapping of Large Cycle Environments", IEEE, Nov. 1999, (10 pages).

KAR, "A Review and Analysis of Eye-Gaze Estimation Systems, Algorithms and Performance Evaluation Methods in Consumer Platforms", Accepted for Publication in IEEE Access. DOI 10.1109/Access.2017.2735633, (Jul. 2017) (25 pages).

Chinese Search Report issued in Chinese Application No. 202080095130.1 dated May 7, 2025, 2 pages.

Huang, "Virtual Reality Technology," Beijing University of Posts and Telecommunications Press, Jan. 31, 2014, pp. 82-84.

* cited by examiner

THREE-DIMENSIONAL (3D) MODELING

CROSS REFERENCE TO RELATED APPLICATIONS

This application is a 35 U.S.C. § 371 National Stage of International Patent Application No. PCT/EP2020/052502, filed 2020 Jan. 31.

TECHNICAL FIELD

Disclosed are embodiments related to 3D modeling of one or more regions of interest.

BACKGROUND

For many industries it is becoming increasingly important to create a digital replica of a physical entity (a.k.a., "region of interest (ROI)), such as a factory, a cell site, a power grid, etc. Such a digital replica is known as a "digital twin." The foundation of such a digital twin comprises a 3D model of the physical entity with accurate scale, which allows for measuring dimensions and distances between objects, as well as their spatial relations.

The first step in creating a 3D model of a physical entity is a structured data acquisition process that typically involves passively and/or actively scanning the entity from different angles. A non-contact active scanning system typically includes an emitter that emits some kind of electromagnetic radiation (e.g., laser light, infra-red, etc.) and a detector that detects the reflections of the emitted radiation off the entity being scanned. In contrast, a non-contact passive scanning system does not emit any kind of radiation itself, but instead relies on detecting reflected ambient radiation. Most solutions of this type detect visible light because it is a readily available ambient radiation. Other types of radiation, such as infra-red, could also be used. Passive scanning methods can be cheap because in most cases they merely require a convention digital camera (e.g., an RGB camera).

The second step in 3D modeling is deploying SfM (Structure-from-Motion) or SLAM (Simultaneous Localization and Mapping) on the collected data. In this process visual (and potentially additional sensory data) is used to create point cloud representing the 3D entity of interest.

SUMMARY

Certain challenges exist. For example, using active scanning generally generates 3D models with significantly higher accuracy (~1 mm resolution) than using passive scanning, but compared to a passive scanning system, an active scanning system requires equipment that is more expensive and consumes more energy. This can become a significant obstacle when the entity of interest is at a remote location and the active scanning system runs on batteries. An infra-red (IR) based stereo camera or a lidar has a power consumption of several watts. For example, Intel RealSense IR based camera could consume up to 3.5 watts and Micro-Vision Consumer Lidar could consume up to 6 Watts at their maximum performance. Running such depth sensors continuously alongside other sensors of the system significantly increases the power consumption.

This disclosure provides an improvement in the data acquisition step. In one aspect, a person's gaze is tracked and used to determine a ROI that needs to be scanned with higher accuracy. This allows more and better data to be aggregated from the relevant parts of the scene, which allows better representation of the ROI in the 3D model. This provides a more accurate and energy efficient process for creating a 3D model of an area.

Accordingly, in one aspect there is provided a method for 3D modeling of one or more regions of interest. The method includes obtaining information indicating that a person's gaze is fixed. Advantageously, the method further includes, in response to obtaining the information indicating that the person's gaze is fixed, initiating an active scan of a ROI, wherein the ROI is a region in which the person's gaze is directed. In some embodiments, the method further incudes obtaining information indicating that the person's gave is no longer fixed and, as a result of obtaining information indicating that the person's gave is no longer fixed, initiating a stopping of the active scan of the ROI.

In another aspect there is provided an apparatus for three-dimensional, 3D, modeling of one or more regions of interest. The apparatus being configured to: obtain information indicating that a person's gaze is fixed. The apparatus is further configured to initiate an active scan of a ROI in response to obtaining the information indicating that the person's gaze is fixed. The ROI is a region in which the person's gaze is directed.

In another aspect there is provided a unmanned aerial vehicle (UAV) for three-dimensional, 3D, modeling. The UAV includes a motor; at least one propeller connected to the motor; processing circuitry; one or more components of an active scanning system; and a receiver for receiving an activation message for activating at least one of the one or more components of the active scanning system. The activation message includes information identifying the location of an ROI in a first coordinate system. The processing circuitry is configured to: determine a pose of a person's head in relation to a pose of the UAV, transform the location of the ROI in the first coordinate system to a location in a second coordinate system, orient a sensor of the active scanning system towards the ROI, and activate the sensor to sense electromagnetic radiation reflected from objects within the ROI.

BRIEF DESCRIPTION OF THE DRAWINGS

The accompanying drawings, which are incorporated herein and form part of the specification, illustrate various embodiments.

DETAILED DESCRIPTION

I. Head-Mounted Eye Tracking Devices

The process of looking consists of two main parts: fixation and gaze shift. A fixation is the maintenance of the gaze in a spot, while gaze shifts correspond to eye movements. Eye gaze trackers give answer to the question "where is a person focusing," i.e. point-of-regard in the visual scene.

That is, eye movements can be broadly categorized into two groups: 1) fixation and 2) saccades (gaze shift). In the fixation phase, eyes are stationary between movements. This phase is corresponded with the attention and interest of the user. Saccades (gaze shifts) are rapid eye movements that happen between fixations. Most modern eye tracking systems use one or more cameras together with NIR (Near Infrared) LEDs. The most commonly used method is PCCR (Pupil Center Corneal Reflection) in which NIR LEDs illuminate the eyes, producing glints on the surface of eye cornea while cameras capture images of the eye. The gaze is estimated from the relative movements between the pupil center and the glint positions. The fixation and saccade phases are calculated based on the continuity and changes in the estimated gaze. (See reference [1]).

Recently there has been a significant progress in the wearable eye trackers (eye tracking glasses). Some examples can be found at: Tobii Pro Eye Tracking Glasses (www.tobiipro.com/product-listing/tobii-pro-glasses-2), Pupil Labs Glasses (pupil-labs.com), Argus Science ETMobile Eye Tracking Glasses (www.argusscience.com/ETMobile.html). The most advanced among these is the Tobii device. It can record 1080p video at 25 fps, has integrated microphone, gyroscope, and accelerometer. The Tobii Pro Glasses 2 API provides access to the streamed live data from the glasses.

These wearable eye gaze trackers provide accurate, real-time calculation of a person's gaze. In an industrial scenario they can be used by a technician on a site mission. Three scenarios (A, B, and C) are described below.

II. Scenario A: User with Head Mounted System (HMS)

Figure 1:
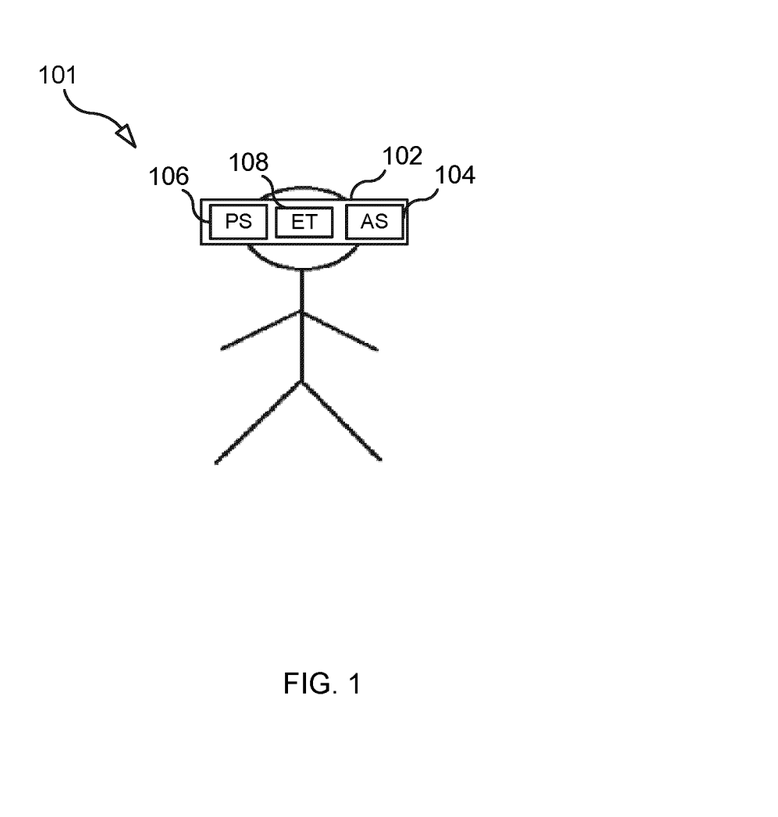
FIG. 1 illustrates a head-mounted system (HMS) according to an embodiment.

In this scenario, a user 101 (e.g., a technician) scanning an area is wearing an HMS 102 equipped with: i) an active scanning (AS) system 104 having at least one sensor for active scanning (e.g. LiDAR) and having at least one emitter (e.g., laser) for emitting electromagnetic radiation (e.g., light), ii) a passive scanning (PS) system 106 having at least one sensor for passive scanning (e.g. RGB camera), and iii) an eye tracker (ET) 108 (a.k.a., eye tracking equipment). In the manufacturing process, the passive and active scanning sensors are calibrated against each other and a transformation matrix between them is known. In other words, every point in a coordinate system for the active scanning sensor has a corresponding point in the coordinate system for the passive scanning sensor.

Figure 2:
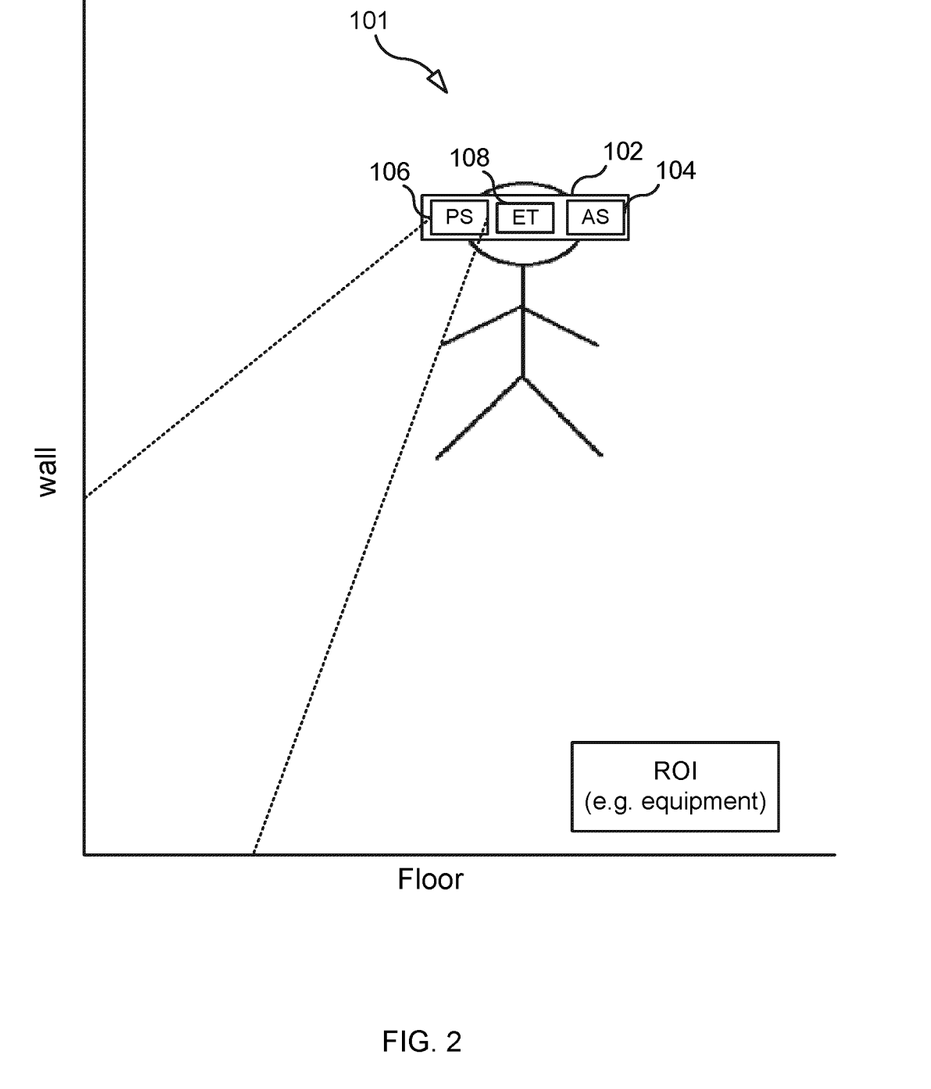
FIG. 2 illustrates a passive scanning scenario.

As the user 101 walks around or moves his head, the RGB camera of PS system 106 is always on and is used to collect data for, for example, SfM that will be used for building a 3D model of the area and/or localization and mapping of the device in its environment. This is illustrated in FIG. 2, which shows user 101 while the user's gaze is not fixed and, therefore, only PS system 106 is activated.

Figure 3:
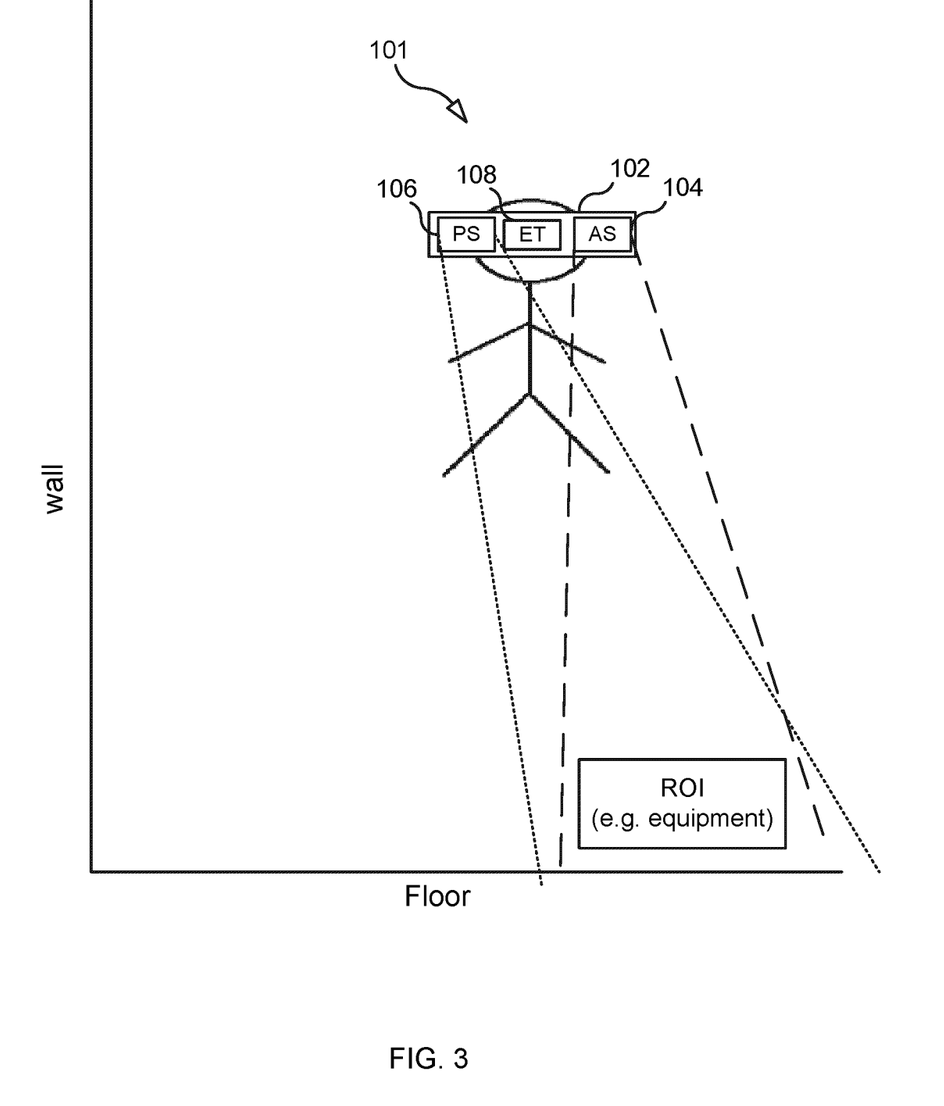
FIG. 3 illustrates an active scanning scenario.

As the main interest of user 101 is around the equipment (denoted ROI in FIG. 2) that has to be accurately modeled, the AS system 104 is activated to scan the ROI as detected by ET 108. This is illustrated in FIG. 3, which shows that, in response to ET 108 detecting that the user 101's gaze is fixed, AS system 104 is activated such that AS system 104 scans the ROI (e.g., object) that the user is gazing at. This allows higher resolution and more accurate 3D model to be built around the ROI in the visual scene, while regions outside user's ROI will receive less attention.

This scenario can be described in the following algorithmic steps:

Step 1: The user enters the environment with only passive scanning sensors activated on the HMS.

Step 2: When user's fixation is detected, turn on sensors for active scanning.

Step 3: When user's gaze shift is detected, turn off sensors for active scanning.

III. Scenario B: User with Gaze Tracker and Drone Scanning the Environment

Figure 4:
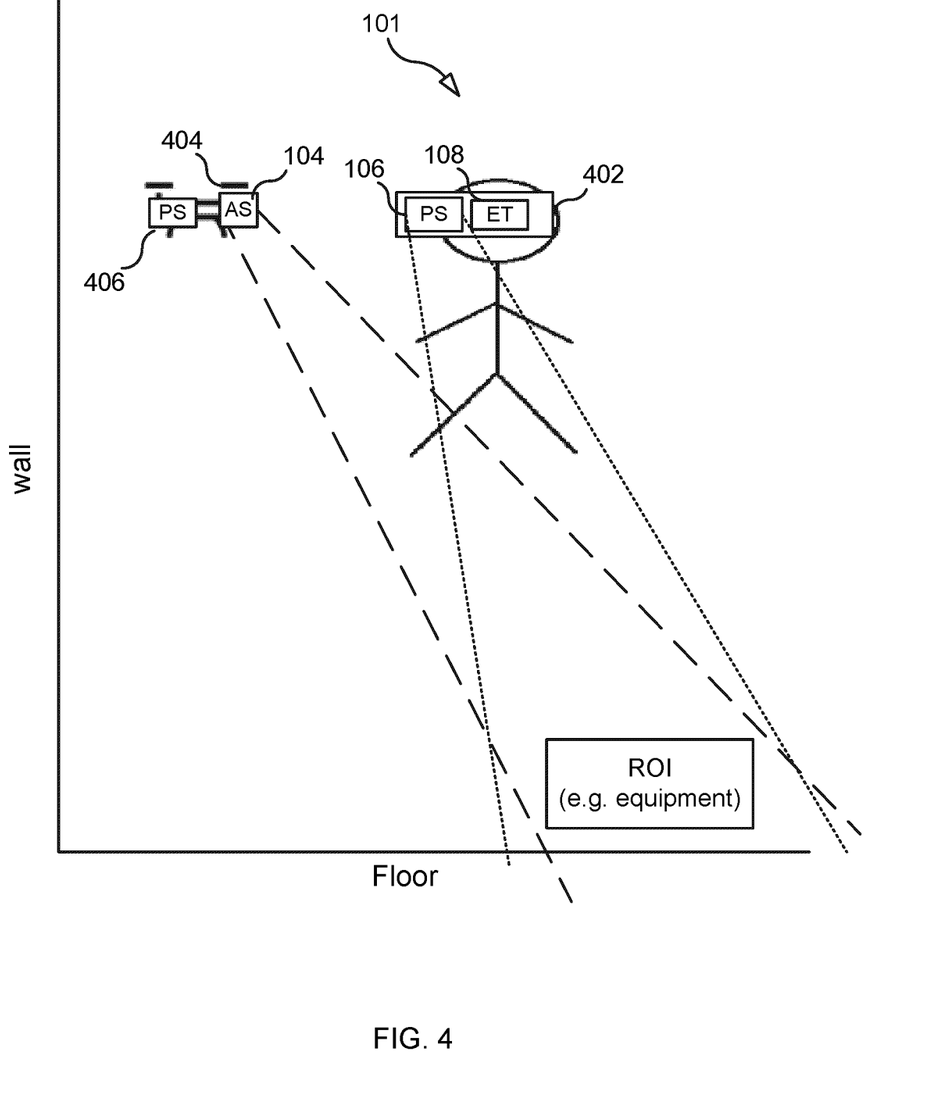
FIG. 4 illustrates a scanning system comprising a UAV and a HMS.

In this scenario, which is illustrated in FIG. 4, user 101 is wearing a HMS 402 equipped with PS system 106 and ET 108, but not AS system 104. HMS 402 does not have AS system 104 because, in this scenario, user 101 is equipped with an Unmanned Aerial Vehicle (UAV) 404 (a.k.a., "drone" 404) that includes AS system 104 to scan and update 3D model of the environment. In this scenario, AS system 104 is built into UAV 404 and the sensors of AS system 104 are calibrated against UAV 404's PS system 406 (e.g., RGB camera). Additionally, a previous 3D model of the environment is made available to both ET 108 and UAV 404. In other words, both ET 108 and UAV 404 can localize themselves in the provided 3D model.

This scenario can be described in the following algorithmic steps:

Step 1: The user enters the environment with UAV 404 and only the passive scanning sensors are activated on UAV 404.

Step 2: As a result of detecting that user 101's gaze is fixed, the following steps are performed:

Step 2a: Retrieve coordinates of the ROI in the coordinate system of the camera of ET 108. These coordinates are denoted: $X_{GL}$, $Y_{GL}$, $Z_{GL}$. This information is provided by ET 108.

Step 2b: Produce the pose of the glasses ($P_{GL}$) in the coordinate system of the 3D model using SLAM algorithms or similar techniques. $P_{GL}$ is a six-dimensional vector that includes both the coordinates and orientation of the glasses in the 3D model's coordinate system. That is: $P_{GL}=(\Delta X, \Delta Y, \Delta Z, \alpha, \beta, \gamma)$, where the first three number define the offset of the coordinate system and the last three numbers define the rotational angles.

Step 2c: Calculate the coordinates of the ROI in the 3D model coordinate system ($X_{3D}$, $Y_{3D}$, $Z_{3D}$) from $X_{GL}$, $Y_{GL}$, $Z_{GL}$ using $P_{GL}$. For example, the change of basis from the glasses to the 3D model coordinate system can be performed as:

$$\begin{bmatrix} X_{3D} \\ Y_{3D} \\ Z_{3D} \end{bmatrix} = \begin{bmatrix} 1 & 0 & 0 \\ 0 & \cos\alpha & \sin\alpha \\ 0 & -\sin\alpha & \cos\alpha \end{bmatrix} \begin{bmatrix} \cos\beta & 0 & -\sin\beta \\ 0 & 1 & 0 \\ \sin\beta & 0 & \cos\beta \end{bmatrix}$$
$$\begin{bmatrix} \cos\gamma & \sin\gamma & 0 \\ -\sin\gamma & \cos\gamma & 0 \\ 0 & 0 & 1 \end{bmatrix} \begin{bmatrix} X_{GL} + \Delta X \\ Y_{GL} + \Delta Y \\ Z_{GL} + \Delta Z \end{bmatrix}$$

Step 2d: transmit from HMS 402 to UAV 404 an activation message. The activation message may comprise the coordinates of the ROI in the 3D model coordinate system ($X_{3D}$, $Y_{3D}$, $Z_{3D}$).

Step 2e: Produce the pose of UAV 404 ($P_{UAV}$) in the coordinate system of the 3D model using SLAM algorithms, e.g., reference [2], or similar techniques. $P_{UAV}$ includes both the coordinates and orientation of the glasses in the 3D model's coordinate system.

Step 2f: Calculate the coordinates of the ROI in UAV 404's coordinate system $(X_{UAV}, Y_{UAV}, Z_{UAV})$ using $(X_{3D}, Y_{3D}, Z_{3D})$ and $P_{UAV}$ Step 2g: After obtaining the coordinates (i.e., location) of the ROI, UAV 404 flies to the proximity of the ROI, orients towards the ROI, and turns on the active scanning sensor(s).

Step 3: When user's gaze shift is detected, switch back to passive scanning.

IV. Scenario C: User with Gaze Tracker and Drone Scanning the Environment without a Prior 3D Model of the Area (First Time Site Visit)

This scenario is similar to scenario B, but user 101 enters the area without a pre-calculated 3D model (e.g., user 101 enters the area for the first time). In this scenario, the following steps are performed:

Step 1: The user enters the area with UAV 404, but with only passive scanning sensors activated on UAV 404.

Step 2: As a result of ET 108 detecting that the user's gaze is fixed, the following steps are performed:

Step 2a: HMS 102 transmits to UAV 404 a message comprising information indicating that ET 108 has determined that user 101 is in a fixation state. The message also contains The coordinates of the ROI in coordinate system of ET 108 $(X_{GL}, Y_{GL}, Z_{GL})$.

Step 2b: UAV 404 determines the pose of ET 108 in relation to itself (UAV's RGB camera coordinate system). HMS 102 is equipped with a marker which UAV 404 tracks, and the relative pose of the marker to the camera of ET 108 is fixed and known.

Step 2c: The coordinates of the ROI in the gaze tracking glasses coordinate system $(X_{GL}, Y_{GL}, Z_{GL})$ are transformed to UAV's RGB camera coordinate system, $(X_{UAV}, Y_{UAV}, Z_{UAV})$ Step 2d: Upon producing the $(X_{UAV}, Y_{UAV}, Z_{UAV})$, UAV 404 flies to the proximity of the ROI, orienting towards the ROI, and turns on its active scanning sensor(s).

Step 3: When user's gaze shift is detected, switch back to passive scanning.

Figure 5:
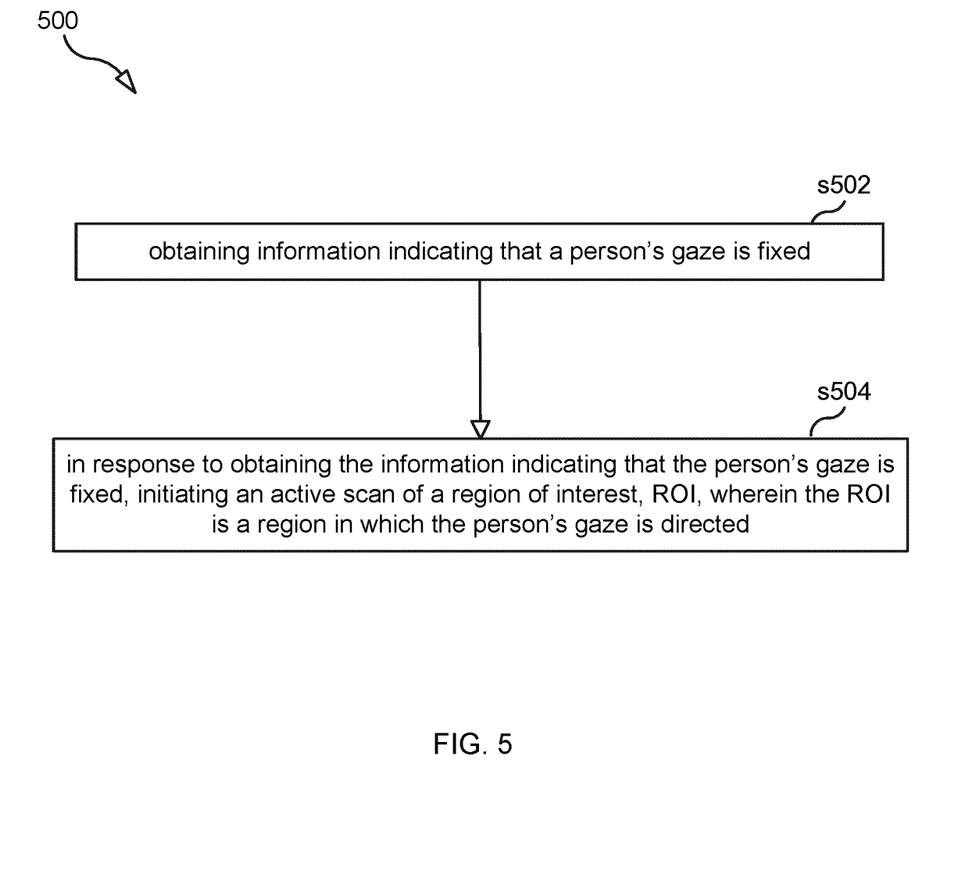
FIG. 5 is a flow chart illustrating a process according to some embodiments.

FIG. 5: User in fixation period. ROI detected and ROI pose sent to UAV. UAV calculates the transforms in its own coordinate system. UAV orients towards ROI and turns on active scanning sensor[s]. Communication between gaze tracker and UAV requires very little bandwidth as only pose of the device is transmitted. Therefore, the communication channel could be realized by Bluetooth or Wi-Fi.

FIG. 5 is a flow chart illustrating a process 500, according to an embodiment, for 3D modeling of one or more regions of interest. Process 500 may begin in step s502. Step s502 comprises obtaining information indicating that a person's gaze is fixed. Step s504 comprises, in response to obtaining the information indicating that the person's gaze is fixed, initiating an active scan of a region of interest, ROI, wherein the ROI is a region in which the person's gaze is directed. In some embodiments, the person is wearing eye tracking equipment 108, and the information indicating that the person's gaze is fixed is obtained from the eye tracking equipment 108. In some embodiments, the person is further wearing one or more components of an AS system (e.g., AS system 104), and the step of initiating the active scan comprises activating at least one of the one or more components of the AS system. In some embodiments, the one or more components of the AS system comprises an emitter (e.g., laser or source of electromagnetic radiation) and/or a sensor, and activating the at least one of the one or more components of the AS system comprises i) activating the emitter such that the emitter emits electromagnetic radiation toward the ROI and/or ii) activating the sensor.

In some embodiments, a UAV (e.g., UAV 404) comprises an AS system, and the step of initiating the active scan comprises activating the UAV's AS system. In some embodiments, activating the UAV's AS system comprises transmitting an activation message to the UAV. In some embodiments, activating the UAV's AS system further comprises: obtaining coordinates of the ROI in a first coordinate system; and deriving a location of the ROI in a coordinate system of a three-dimensional, 3D, model, wherein the activation message comprises information identifying the location of the ROI in the coordinate system of the 3D model. In some embodiments, the UAV is configured such that, in response to receiving the activation message, the UAV: flies to a position in proximity to the ROI, orients a sensor of the AS system towards the ROI, and activates the sensor.

In some embodiments, activating the UAV's AS system further comprises determining a location of the ROI in a first coordinate system (e.g., coordinate system of the eye tracking equipment), the activation message comprises information identifying the location of the ROI in the first coordinate system, and the UAV is configured such that, in response to receiving the activation message comprising the information identifying the location of the ROI in the first coordinate system, the UAV: determines a pose of the person's head in relation to a pose of the UAV, transforms the location of the ROI in the first coordinate system to a location in a second coordinate system (e.g., UAV's RGB camera coordinate system), orients a sensor of the AS system towards the ROI, and activates the sensor to sense electromagnetic radiation (e.g., light beam, infra-red beam) reflected from objects within the ROI.

In some embodiments, the UAV is further configured such that, in response to receiving the activation message comprising the information identifying the location of the ROI in the first coordinate system, the UAV further: orients an emitter (e.g., laser) of the AS system towards the ROI, and activates the emitter to emit electromagnetic radiation toward the ROI.

In some embodiments, process 500 further incudes obtaining information indicating that the person's gave is no longer fixed, and, as a result of obtaining information indicating that the person's gave is no longer fixed, initiating a stopping of the active scan of the ROI. For example, in the embodiments where UAV 404 comprises AS system 104 instead of HMS 102, when the eye tracking equipment 108 detects that the person's gaze is no longer fixed, HMS 102 sends a deactivation message to UAV 404 instructing UAV 404 to deactivate AS system 104, thereby ceasing the active scanning of the ROI.

Figure 6:
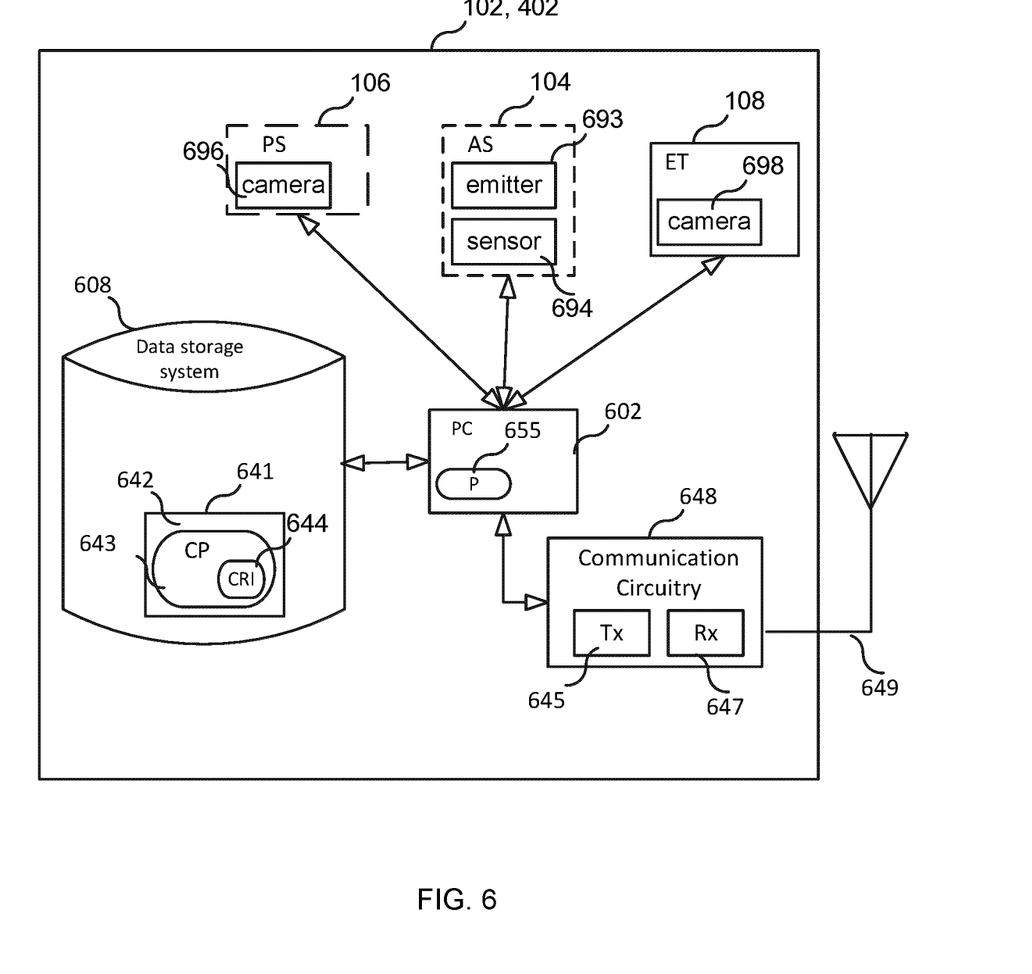
FIG. 6 is a block diagram illustrating a head-mounted system (HMS) according to an embodiment.

FIG. 6 is a block diagram of HMS 102, 402, according to some embodiments. As shown in FIG. 6, HMS 102 comprises: processing circuitry (PC) 602, which may include one or more processors (P) 655 (e.g., one or more general purpose microprocessors and/or one or more other processors, such as an application specific integrated circuit (ASIC), field-programmable gate arrays (FPGAs), and the like); ET 108, which comprises a camera 698 for use in eye tracking; communication circuitry 648, which is coupled to an antenna arrangement 649 comprising one or more antennas and which comprises a transmitter (Tx) 645 and a receiver (Rx) 647 for enabling the HMS to transmit data and receive data (e.g., wirelessly transmit/receive data); and a local storage unit (a.k.a., "data storage system") 608, which may include one or more non-volatile storage devices and/or one or more volatile storage devices. As described herein, the HMS may also include PS system 106, which includes a camera 696, and AS system 104, which includes an emitter 693 and a sensor 694. In embodiments where PC 602 includes a programmable processor, a computer program product (CPP) 641 may be provided. CPP 641 includes a computer readable medium (CRM) 642 storing a computer program (CP) 643 comprising computer readable instructions (CRI) 644. CRM 642 may be a non-transitory computer readable medium, such as, magnetic media (e.g., a hard disk), optical media, memory devices (e.g., random access memory, flash memory), and the like. In some embodiments, the CRI 644 of computer program 1043 is configured such that when executed by PC 602, the CRI causes the HMS to perform steps described herein. In other embodiments, the HMS may be configured to perform steps described herein without the need for code. That is, for example, PC 602 may consist merely of one or more ASICs. Hence, the features of the embodiments described herein may be implemented in hardware and/or software.

Figure 7:
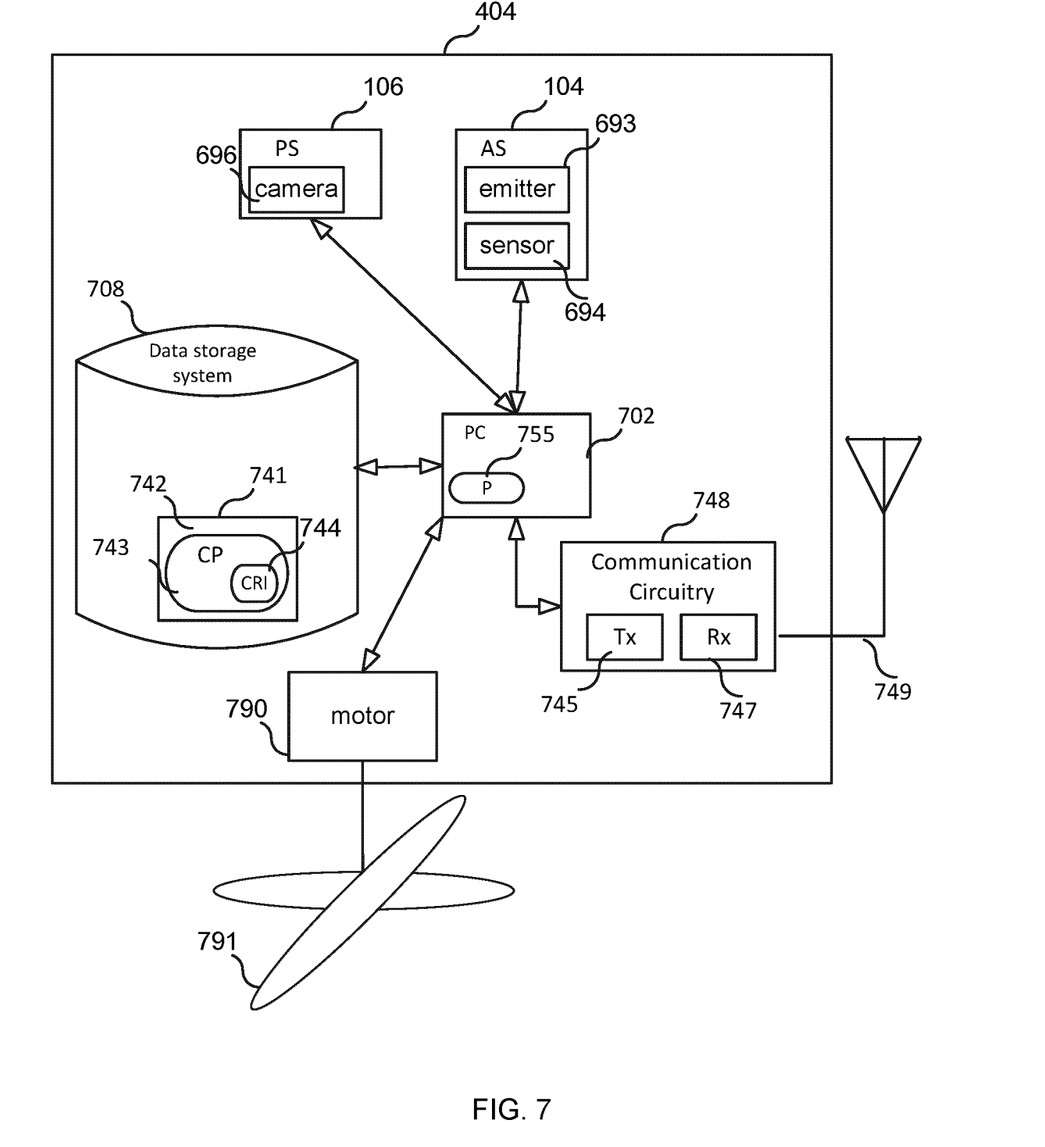
FIG. 7 is a block diagram illustrating a UAV according to an embodiment.

FIG. 7 is a block diagram of UAV 404, according to some embodiments. As shown in FIG. 7, UAV 404 comprises: processing circuitry (PC) 702, which may include one or more processors (P) 755 (e.g., one or more general purpose microprocessors and/or one or more other processors, such as an application specific integrated circuit (ASIC), field-programmable gate arrays (FPGAs), and the like); PS system 106; AS system 104; communication circuitry 748, which is coupled to an antenna arrangement 749 comprising one or more antennas and which comprises a transmitter (Tx) 745 and a receiver (Rx) 747 for enabling UAV 404 to transmit data and receive data (e.g., wirelessly transmit/receive data); a local storage unit (a.k.a., "data storage system") 708, which may include one or more non-volatile storage devices and/or one or more volatile storage devices; a motor 790; and propellers 791 coupled to the motor. In embodiments where PC 702 includes a programmable processor, a computer program product (CPP) 741 may be provided. CPP 741 includes a computer readable medium (CRM) 742 storing a computer program (CP) 743 comprising computer readable instructions (CRI) 744. CRM 742 may be a non-transitory computer readable medium, such as, magnetic media (e.g., a hard disk), optical media, memory devices (e.g., random access memory, flash memory), and the like. In some embodiments, the CRI 744 of computer program 743 is configured such that when executed by PC 702, the CRI causes UAV 404 to perform steps described herein. In other embodiments, UAV 404 may be configured to perform steps described herein without the need for code. That is, for example, PC 702 may consist merely of one or more ASICs. Hence, the features of the embodiments described herein may be implemented in hardware and/or software.

As demonstrated above, by activating the AS system 104 based on the gaze of the user 110, a 3D model of a ROI can be created in an accurate and more energy efficient way, which in turn allows a remote site to be successfully scanned using only battery powered devices.

While various embodiments are described herein, it should be understood that they have been presented by way of example only, and not limitation. Thus, the breadth and scope of this disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

REFERENCES

[1] A. Kar and P. Corcoran, "A Review and Analysis of Eye-Gaze Estimation Systems, Algorithms and Performance Evaluation Methods in Consumer Platforms," in IEEE Access, vol. 5, pp. 16495-16519, 2017. doi: 10.1109/ACCESS.2017.2735633.
[2] J. Gutmann and K. Konolige, "Incremental Mapping of Large Cyclic Environments," in Proc. IEEE Int. Symp. Comput. Intell. Robot. Automat., 1999.

The invention claimed is:

1. A method for three-dimensional (3D) modeling of one or more regions of interest, the method comprising:
activating a passive scan;
obtaining information indicating that a person's gaze is fixed;
in response to obtaining the information indicating that the person's gaze is fixed, switching from the passive scan to an active scan of a region of interest (ROI) wherein the ROI is a region in which the person's gaze is directed;
after switching from the passive scan to the active scan, obtaining information indicating that the person's gaze has shifted away from the ROI; and
in response to obtaining the information indicating that the person's gaze has shifted away from the ROI, deactivating the active scan of the ROI and reactivating the passive scan.

2. The method of claim 1, wherein
the person is wearing eye tracking equipment, and
the information indicating that the person's gaze is fixed is obtained from the eye tracking equipment.

3. The method of claim 2, wherein
the person is further wearing one or more components of an active scanning system, and
the step of switching from the passive scan to the active scan comprises activating at least one of the one or more components of the active scanning system.

4. The method of claim 3, wherein
the one or more components of the active scanning system comprises an emitter and/or a sensor, and
activating the at least one of the one or more components of the active scanning system comprises i) activating the emitter such that the emitter emits electromagnetic radiation toward the ROI and/or ii) activating the sensor such that the sensor can detect radiation reflected from the ROI.

5. The method of claim 1, wherein
an unmanned aerial vehicle (UAV) comprises an active scanning system, and
the step of switching from the passive scan to the active scan comprises activating the UAV's active scanning system.

6. The method of claim 5, wherein activating the UAV's active scanning system comprises transmitting an activation message to the UAV.

7. The method of claim 6, wherein activating the UAV's active scanning system further comprises:
obtaining coordinates of the ROI in a first coordinate system; and
deriving a location of the ROI in a coordinate system of a three-dimensional (3D) model, wherein the activation message comprises information identifying the location of the ROI in the coordinate system of the 3D model.

8. The method claim 6, wherein the UAV is configured such that, in response to receiving the activation message, the UAV: flies to a position in proximity to the ROI, orients a sensor of the active scanning system towards the ROI, and activates the sensor.

9. The method of claim 6, wherein
activating the UAV's active scanning system further comprises determining a location of the ROI in a first coordinate system,
the activation message comprises information identifying the location of the ROI in the first coordinate system, and
the UAV is configured such that, in response to receiving the activation message comprising the information identifying the location of the ROI in the first coordinate system, the UAV:
determines a pose of the person's head in relation to a pose of the UAV,
transforms the location of the ROI in the first coordinate system to a location in a second coordinate system,
orients a sensor of the active scanning system towards the ROI, and
activates the sensor to sense electromagnetic radiation reflected from objects within the ROI.

10. The method of claim 9, wherein the UAV is further configured such that, in response to receiving the activation message comprising the information identifying the location of the ROI in the first coordinate system, the UAV further:
orients an emitter of the active scanning system towards the ROI, and
activates the emitter to emit electromagnetic radiation toward the ROI.

11. An apparatus for three-dimensional (3D) modeling of one or more regions of interest, the apparatus comprising:
memory; and
processing circuitry coupled to the memory, wherein apparatus is configured to:
activate a passive scan;
obtain information indicating that a person's gaze is fixed;
in response to obtaining the information indicating that the person's gaze is fixed, switch from the passive scan to an active scan of a region of interest (ROI) wherein the ROI is a region in which the person's gaze is directed;
after switching from the passive scan to the active scan, obtain information indicating that the person's gaze has shifted away from the ROI; and
in response to obtaining the information indicating that the person's gaze has shifted away from the ROI, deactivate the active scan of the ROI and reactivate the passive scan.

12. The apparatus of claim 11, wherein the apparatus comprises a head-mounted system that comprises eye tracking equipment for generating the information indicating that the person's gaze is fixed.

13. The apparatus of claim 12, wherein
the apparatus further comprises one or more components of an active scanning system, and
the apparatus is configured to switch from the passive scan to the active scan by performing a process that includes activating at least one of the one or more components of the active scanning system.

14. The apparatus of claim 13, wherein
the one or more components of the active scanning system comprises an emitter and/or a sensor, and
the apparatus is configured to activate the at least one of the one or more components of the active scanning system by performing a process that includes: i) activating the emitter such that the emitter emits electromagnetic radiation toward the ROI and/or ii) activating the sensor.

15. The apparatus of claim 11, wherein
the apparatus further comprises a transmitter for transmitting control messages to an unmanned aerial vehicle (UAV) that comprises one or more components of an active scanning system, and
the apparatus is configured to switch from the passive scan to the active scan by performing a process that includes transmitting to the UAV an activation message for activating at least one of the one or more components of the active scanning system.

16. The apparatus of claim 15, wherein the apparatus is further configured to:
obtain coordinates of the ROI in a first coordinate system; and
derive a location of the ROI in a coordinate system of a three-dimensional (3D) model, wherein
the activation message comprises information identifying the location of the ROI in the coordinate system of the 3D model.

17. The apparatus of claim 15, wherein
the apparatus is further configured to determine a location of the ROI in a first coordinate system, and
the activation message comprises information identifying the location of the ROI in the first coordinate system.

18. An unmanned aerial vehicle (UAV) for three-dimensional (3D) modeling, the UAV comprising:
a motor;
at least one propeller connected to the motor;
processing circuitry;
one or more components of a passive scanning system;
one or more components of an active scanning system; and
a receiver for receiving an activation message for activating at least one of the one or more components of the active scanning system, the activation message comprising information identifying the location of a region of interest (ROI) in a first coordinate system, wherein the processing circuitry is configured to perform the following steps in response to receiving the activation message:
deactivate a sensor of the passive scanning system;
determine a pose of the UAV;
calculate a location of the ROI in a second coordinate system using the determined pose of the UAV and the information identifying the location of the ROI in the first coordinate system;
orient a sensor of the active scanning system of the active scanning system towards the ROI; and
activate the sensor to sense electromagnetic radiation reflected from objects within the ROI, wherein the processing circuitry is further configured to perform the following steps in response to receiving a deactivation message:
deactivate the sensor of the active scanning system; and
reactivate the sensor of the passive scanning system.

19. The UAV of claim 18, wherein the UAV is further configured such that, in response to receiving the activation message comprising the information identifying the location of the ROI in the first coordinate system, the UAV further:

orients an emitter of the active scanning system towards the ROI; and activates the emitter to emit electromagnetic radiation toward the ROI.

20. A non-transitory computer readable storage medium storing a computer program comprising instructions which when executed by processing circuitry causes the processing circuitry to perform the method of claim 1.

\* \* \* \* \*